US008907974B2

(12) United States Patent
Yoshimoto

(10) Patent No.: US 8,907,974 B2

(45) Date of Patent: Dec. 9, 2014

(54) IMAGE PROCESSING APPARATUS, DISPLAY APPARATUS, AND IMAGE PROCESSING METHOD

(71) Applicant: Seiko Epson Corporation, Tokyo (JP)

(72) Inventor: Hiroshi Yoshimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 198 days.

(21) Appl. No.: 13/633,981

(22) Filed: Oct. 3, 2012

(65) Prior Publication Data

US 2013/0088509 A1 Apr. 11, 2013

(30) Foreign Application Priority Data

Oct. 6, 2011 (JP) ................................ 2011-221876

(51) Int. Cl.

| | |
|---|---|
| ***G09G 5/00*** | (2006.01) |
| ***G09G 5/02*** | (2006.01) |
| ***G09G 5/10*** | (2006.01) |
| ***H04N 5/00*** | (2011.01) |
| ***H04N 3/24*** | (2006.01) |
| ***H04N 9/64*** | (2006.01) |
| ***H04N 9/28*** | (2006.01) |
| ***H04N 1/46*** | (2006.01) |
| ***G03F 3/08*** | (2006.01) |
| ***G06K 9/00*** | (2006.01) |
| ***G06K 9/40*** | (2006.01) |
| ***G06K 9/32*** | (2006.01) |
| ***G09G 3/20*** | (2006.01) |
| *G06K 9/36* | (2006.01) |

(52) U.S. Cl.

CPC ...... *G09G 3/2003* (2013.01); *G09G 2300/0452* (2013.01); *G09G 2340/0407* (2013.01); *G09G 2340/06* (2013.01)

USPC ........... 345/600; 345/581; 345/589; 345/644; 345/660; 345/690; 348/607; 348/630; 348/708; 348/807; 358/518; 358/525; 382/166; 382/167; 382/274; 382/299; 382/300

(58) Field of Classification Search

USPC ......... 345/581, 589–590, 600, 605–606, 613, 345/616, 643–644, 660, 670–672, 204, 690, 345/698, 22, 55, 63; 348/254, 277, 606, 348/607, 630, 708, 739, 807; 358/518–520, 358/523, 525; 382/162, 165–166, 167, 254, 382/274, 276, 298

See application file for complete search history.

(56) References Cited

U.S. PATENT DOCUMENTS

| | | | | |
|---|---|---|---|---|
| 6,088,014 | A | 7/2000 | Furuhashi et al. | |
| 6,115,020 | A | 9/2000 | Taguchi et al. | |
| 7,995,019 | B2 * | 8/2011 | Ben-David et al. ............. | 345/88 |

(Continued)

FOREIGN PATENT DOCUMENTS

| | | | |
|---|---|---|---|
| JP | 60-61724 | A | 4/1985 |
| JP | 9-269757 | A | 10/1997 |

(Continued)

*Primary Examiner* — Wesner Sajous

(74) *Attorney, Agent, or Firm* — ALG Intellectual Property, LLC

(57) ABSTRACT

When a single pixel is displayed by four color sub-pixels, or R (red), G (green), B (blue), and G, in a Bayer array, this invention sets the scaling rate of a scaling process to 3/2 times when executing the scaling process on image data having three color components, or R, G, and B, and then executes a color conversion process for finding four color components from the three color components; after this, a decimation process for reducing the number of pixels is carried out. Setting the scaling rate of the scaling process to an integer proportion, moirés caused by the scaling process can be made less noticeable. Note that it is desirable for the scaling rate of the scaling process to be close to √2 and for the denominator of the integer proportion to be lower.

7 Claims, 4 Drawing Sheets

(56) References Cited

U.S. PATENT DOCUMENTS

| | | | | |
|---|---|---|---|---|
| 2002/0008820 | A1 | 1/2002 | Yagi et al. | |
| 2004/0156077 | A1 * | 8/2004 | Kakutani | 358/3.04 |
| 2005/0270444 | A1 * | 12/2005 | Miller et al. | 349/108 |
| 2006/0125852 | A1 * | 6/2006 | Yamakado | 347/5 |
| 2007/0139437 | A1 * | 6/2007 | Boroson et al. | 345/590 |
| 2007/0257943 | A1 * | 11/2007 | Miller et al. | 345/694 |
| 2008/0068402 | A1 | 3/2008 | Ioka et al. | |

FOREIGN PATENT DOCUMENTS

| | | | |
|---|---|---|---|
| JP | 10-83168 | A | 3/1998 |
| JP | 2002-82349 | A | 3/2002 |
| JP | 2004-117752 | A | 4/2004 |
| JP | 2008-96956 | A | 4/2008 |

* cited by examiner

R, B FILTER PROPERTIES

G FILTER PROPERTIES

IMAGE PROCESSING APPARATUS, DISPLAY APPARATUS, AND IMAGE PROCESSING METHOD

BACKGROUND

1. Technical Field

The present invention relates to techniques for displaying images using pixels configured of four sub-pixels.

2. Related Art

In a Bayer array, a single pixel is configured of four sub-pixels, where two G (green) sub-pixels and one each of R (red) and B (blue) sub-pixels are used; the array disposes pixels, in which two each of the sub-pixels are arranged in the vertical and horizontal directions, in matrix form. Techniques that replace one of the G sub-pixels in a Bayer array with another color (for instance, white) are also known (for example, see JP-A-60-61724).

Meanwhile, image data having such pixels that is inputted into a display apparatus is generally expressed as three colors, which are R, G, or B, for each pixel. Accordingly, in order to display the image, the display apparatus executes a color conversion process for finding four color tone values from three color tone values, a decimation process for removing data of pixels that cannot be displayed, and so on.

Considering the G color display, which has the most influence on a human's visual sense of definition, the resolution of that color in the vertical and horizontal directions corresponds, in a Bayer array display apparatus, to $1/\sqrt{2}$ (that is, the inverse of the square root of 2) times the number of pixels (or in other words, the total number of sub-pixels) of the display apparatus. Accordingly, for G color displays, canceling out a drop in the resolution by increasing the size (that is, the number of pixels) of the image data to $\sqrt{2}$ times through a scaling process has been considered as a way to achieve the same resolution as the inputted image data. However, executing such a scaling process that focuses only on the resolution is problematic in that moirés become noticeable when the image is displayed.

SUMMARY

Accordingly, it is an advantage of some aspects of the invention to implement an image display that obtains a visually desirable resolution while making moirés less noticeable.

An image processing apparatus according to an aspect of the invention is an image processing apparatus for displaying an image in a display panel in which pixels configured of four sub-pixels, with two sub-pixels each disposed in a first direction and a second direction orthogonal to the first direction, are disposed in matrix form, and includes: an obtainment unit that obtains image data in which each pixel disposed in the first direction and the second direction is expressed as a three-color tone value; a scaling unit that enlarges the first direction and second direction sizes, respectively, of an image expressed by the image data obtained by the obtainment unit by n/m times (where m and n are predetermined integers that fulfill $1<n/m<2$); a color conversion unit that converts the three-color image data enlarged by the scaling unit into four-color image data that corresponds to the four sub-pixels; and a decimating unit that reduces the number of pixels in the image data resulting from the conversion performed by the color conversion unit in accordance with the disposition of the four sub-pixels.

According to this image processing apparatus, it is possible to implement an image display that obtains a visually desirable resolution while making moirés less noticeable.

According to another aspect of the invention, it is preferable that, in the image processing apparatus, $m\leq 10$, and more preferably, $m=2$ and $n=3$.

According to this aspect, it is possible to make moirés even less noticeable.

A display apparatus according to another aspect of the invention, it is preferable that the display apparatus include the image processing apparatus and a display panel in which the total number of the sub-pixels is greater than or equal to n/m times the number of pixels in the image data.

According to this display apparatus, it is possible to implement an image display that obtains a visually desirable resolution while making moirés less noticeable.

An image processing method according to another aspect of the invention is an image processing method for displaying an image in a display panel in which pixels configured of four sub-pixels, with two sub-pixels each disposed in a first direction and a second direction orthogonal to the first direction, are disposed in matrix form, and includes: obtaining image data in which each pixel disposed in the first direction and the second direction is expressed as a three-color tone value; executing a scaling process that enlarges the first direction and second direction sizes, respectively, of an image expressed by the obtained image data by n/m times (where m and n are predetermined integers that fulfill $1<n/m<2$); executing a color conversion process that converts the three-color image data enlarged by the scaling process into four-color image data that corresponds to the four sub-pixels; and executing a decimation process that reduces the number of pixels in the image data resulting from the color conversion process in accordance with the disposition of the four sub-pixels.

According to this image processing method, it is possible to implement an image display that obtains a visually desirable resolution while making moirés less noticeable.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment

Figure 1:
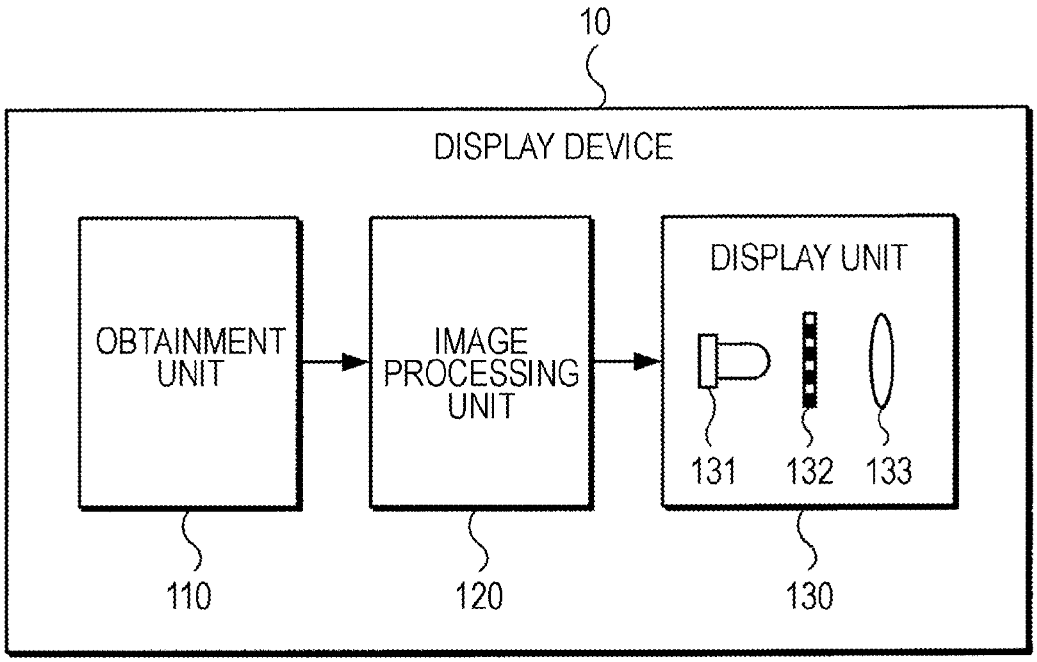
FIG. 1 is a block diagram illustrating the hardware configuration of a projector.

FIG. 1 is a block diagram illustrating the hardware configuration of a projector 10 embodying the invention. The projector 10 is what is known as a single-plate projector, and is a comparatively small-sized projector, such as a pico projector or a micro projector. The projector 10 includes an obtainment unit 110, an image processing unit 120, and a display unit 130.

The obtainment unit 110 is a unit that obtains image data. The obtainment unit 110 includes a communication interface based on a predetermined standard such as USB (Universal Serial Bus) or IrDA (Infrared Data Association), and obtains image data sent from an external device (a personal computer or the like). Alternatively, the obtainment unit 110 includes a reader for a removable recording medium such as a memory card or the like, and may be configured to read image data stored in the recording medium, or may be configured to include functionality of both a single or a plurality of communication interfaces and readers.

The image data according to this embodiment is data expressing a color image, and is image data of what is known as the nHD size, where each pixel is expressed by tone values of three colors, or R, G, and B. This image data is image data having a 16:9 aspect ratio and a resolution of 640×360, or in other words, 640 pixels in the horizontal direction and 360 pixels in the vertical direction. Meanwhile, while no particular limitation is placed on the number of tones for each color in the image data, it is assumed here that this number is 256 tones (in other words, tone values of 0 to 255). Note that the "image data" referred to here may be image data expressing a still image or image data expressing a moving picture.

The image processing unit 120 is a unit that executes image processes on the image data obtained by the obtainment unit 110. The image processing unit 120 executes at least a scaling process that converts the size of an image (in other words, the number of pixels in the image data), a color conversion process that converts three color, or R, G, and B, image data into four color image data, and a decimation process that reduces the number of pixels of the image data. These image processes are executed to make the image data compatible with the configuration properties of the display unit 130. Note that the image processing unit 120 may execute other known image processes, such as a gamma process, in addition to the stated image processes.

The display unit 130 is a unit that displays an image based on the image data on which the image processes have been executed by the image processing unit 120. The display unit 130 displays the image by projecting light onto a screen, and includes a light source 131, a liquid-crystal panel 132, and a projection optical system 133. The light source 131 includes an LED (light emitting diode), a laser diode, or the like, and emits white light. The liquid-crystal panel 132 includes a transmissive display panel having a Bayer array and a driving circuit therefor. The liquid-crystal panel 132 configures a single pixel using four sub-pixels. Each sub-pixel of the liquid-crystal panel 132 is a liquid-crystal element (light modulating element) configured to control the state of light transmission using a color filter or the like so that components of a specific wavelength of the white light pass through. The projection optical system 133 includes a member for projecting the light that has passed through the liquid-crystal panel 132. Although the projection optical system 133 is shown in a simplified manner in FIG. 1, it should be noted that the projection optical system 133 may be configured using a plurality of lenses, and may include lenses aside from convex lenses.

Note that the total number of sub-pixels in the liquid-crystal panel 132 is assumed here to be 960 in the horizontal direction and 540 in the vertical direction. In other words, the total number of sub-pixels in the liquid-crystal panel 132 is 1.5×1.5 times (9/4 times) the number of pixels in the image data inputted into the projector 10. However, because the liquid-crystal panel 132 configures a single pixel using four sub-pixels, this number is not the number of sub-pixels itself, but is ¼ of that number.

Figure 2:
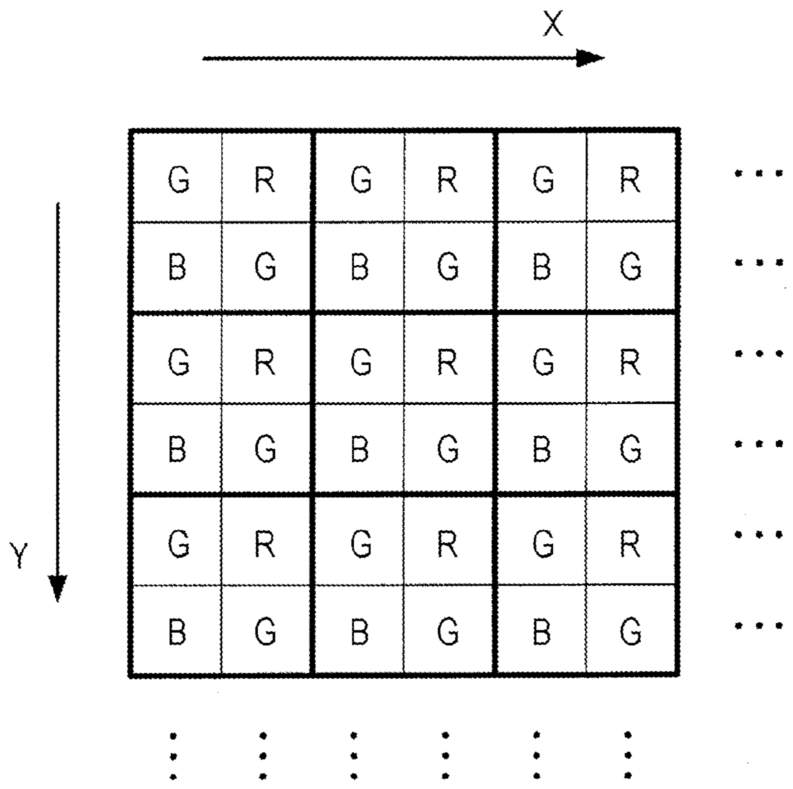
FIG. 2 is a diagram illustrating an arrangement of sub-pixels in a liquid-crystal panel.

FIG. 2 is a diagram illustrating an arrangement of sub-pixels in the liquid-crystal panel 132. In FIG. 2, the X direction corresponds to the horizontal direction, and the Y direction corresponds to the vertical direction. In the liquid-crystal panel 132, the sub-pixels are arranged in the X direction and the Y direction, which is orthogonal thereto, as shown in FIG. 2; a single pixel is configured of two sub-pixels that are adjacent in the X direction and two sub-pixels that are adjacent in the Y direction to the previously mentioned two sub-pixels. In the liquid-crystal panel 132, sub-pixels corresponding to G and R are arranged in order in the odd-numbered rows that follow the X direction, whereas sub-pixels corresponding to B and G are arranged in order in the even-numbered rows that follow the X direction. Likewise, in the liquid-crystal panel 132, sub-pixels corresponding to G and B are arranged in order in the odd-numbered columns that follow the Y direction, whereas sub-pixels corresponding to R and G are arranged in order in the even-numbered columns that follow the Y direction. Note that here, the X direction corresponds to a first direction according to the invention, whereas the Y direction corresponds to a second direction according to the invention.

Here, it is assumed that the sub-pixels are squares having the same size, and the intervals thereof are the same in both the X direction and the Y direction. This results in the four sub-pixels of which a single pixel is configured being disposed in a square shape. The liquid-crystal panel 132 is configured by arranging these square-shaped pixels in the X direction and the Y direction in matrix form. Here, the G sub-pixels within a single pixel are located at opposing corners.

The liquid-crystal panel 132 allows R, G, and B color light to selectively pass using these sub-pixels, and controls the transmissibility of that light on a sub-pixel-by-sub-pixel basis in accordance with the image that is displayed. Through this, the projector 10 realizes a color image display through an additive color mixture (an aligned additive color mixture).

Figure 3:
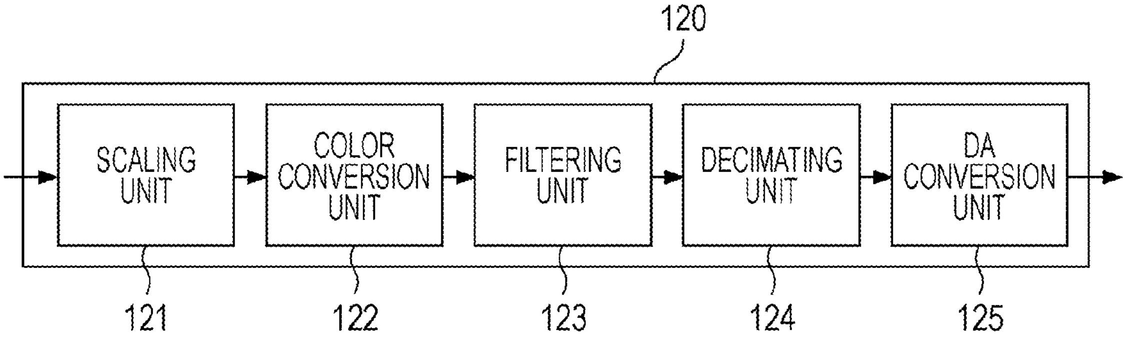
FIG. 3 is a block diagram illustrating the configuration of an image processing unit in more detail.

FIG. 3 is a block diagram illustrating the configuration of the image processing unit 120 in detail. The image processing unit 120 includes at least a scaling unit 121, a color conversion unit 122, a filtering unit 123, a decimating unit 124, and a DA conversion unit 125. The image processing unit 120 executes the respective processes in the order indicated by the arrows in FIG. 3.

The scaling unit 121 executes a scaling process. The scaling process executed by the scaling unit 121 increases the number of pixels in the vertical direction and the horizontal direction by 1.5 times (3/2 times), enlarging the size of the image by 1.5 times. Accordingly, the image data changes from a size of 640×360, pre-scaling process, to a size of 960×540, post-scaling process. The number of pixels in the image data after the scaling process matches the number of sub-pixels in the liquid-crystal panel 132.

Note that the specific method used in the scaling process performed by the scaling unit 121 is not particularly limited. For example, the scaling unit 121 may calculate tone values for each pixel using a bilinear method (in other words, interpolation), a bicubic method or a nearest neighbor method, or a method aside from those mentioned here.

The color conversion unit 122 executes a color conversion process, and the color conversion process executed by the color conversion unit 122 converts pixels configured of three color, or R, G, and B, tone values into pixels configured of four color, or R, G, B, and G, tone values. The specific method of the color conversion process may be any known technique applied to Bayer arrays.

Note that “four color tone values” indicates the tone values allocated to each of the four sub-pixels, and it is not absolutely necessary for these to be tone values allocated to each of four mutually different colors. In this embodiment, two colors of the four color tone values are tone values allocated to G sub-pixels, and thus the colors themselves are not necessarily different. However, as described in the variation mentioned later, tone values allocated to each of four mutually different colors correspond to the “four color tone values” in the case where the colors corresponding to four sub-pixels are all different from each other.

The filtering unit 123 executes a filtering process. The filtering process executed by the filtering unit 123 is a process for cutting aliasing noise resulting from a reduction in the resolution of the image data caused by the decimation process, and to be more specific, is a process that restricts the spatial frequency bandwidth of the image data to a predetermined range. The filter applied at this time is a low-pass filter. Although the aliasing noise produces moirés, the moirés produced here are different from the moirés resulting from the scaling process.

Figure 4A:
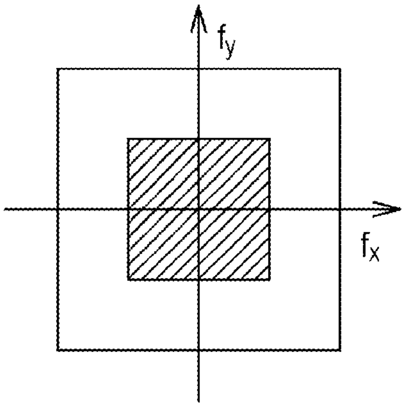
FIGS. 4A and 4B are diagrams illustrating examples of filter properties in a filtering unit.
Figure 4B:
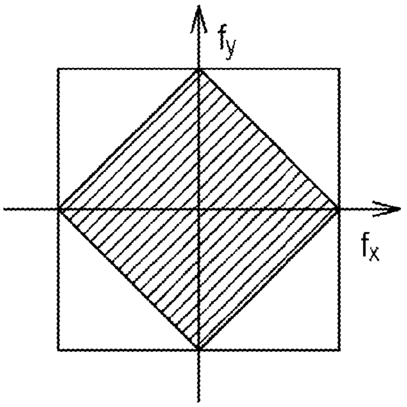

FIGS. 4A and 4B are diagrams illustrating examples of filter properties in the filtering unit 123. FIG. 4A illustrates properties of a filter applied to an R component or a B component of image data, whereas FIG. 4B illustrates properties of a filter applied to a G component of image data. Note that in FIGS. 4A and 4B, the horizontal axis ($f_x$) expresses a frequency in the X direction, whereas the vertical axis ($f_y$) expresses a frequency in the Y direction. Furthermore, in FIGS. 4A and 4B, the frequency band of the inputted image data is indicated by a solid line, whereas the bands that pass through the filter (that is, the bands that are not cut by the filter) are indicated by hatching.

As shown in FIG. 4A, in a Bayer array, the bands of the R component and the B component of the image data in both the X direction and the Y direction are generally restricted to the lower half. This is because only one each of the R and B sub-pixels is disposed in both the X direction and the Y direction, and can only express an image at half the resolution of the inputted image data. On the other hand, because there are two G sub-pixels in each single pixel, the filter for the G sub-pixels has half the band restriction as for the R or B sub-pixels.

Figure 5:
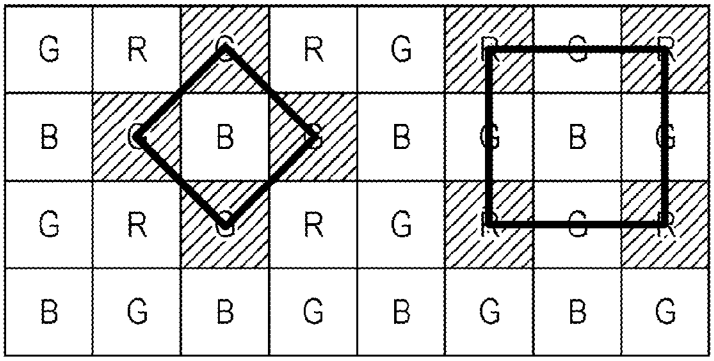
FIG. 5 is a diagram illustrating a grid formed by sub-pixels in a Bayer array.

FIG. 5 is a diagram illustrating a grid formed by sub-pixels in a Bayer array. As shown in FIG. 5, the grid configured by the G sub-pixels is a square having shorter sides than the grid configured by the R (or B) sub-pixels, and is also tilted by 45° relative to the grid configured by the R sub-pixels. When comparing the G sub-pixels and the R sub-pixels, the sides of the respective grids have lengths where the former is $\sqrt{2}/2$ (that is, a number in which the square root of 2 is divided by 2) times the latter. Accordingly, in a Bayer array, a higher-resolution display is possible with the G sub-pixels, and the pass-band for the G component can be made wider than the pass-band for the R component (or the B component).

The decimating unit 124 executes a decimation process. The decimation process executed by the decimating unit 124 reduces, to ¼, the number of pixels in the image data of each color whose bands have been restricted by the filtering unit 123. In other words, the image data changes from a size of 960×540 prior to the decimation process to a size of 480×270 after the decimation process. Note that any appropriate known method may be used as the specific method for the decimation process.

The DA conversion unit 125 executes DA conversion on the image data, which is digital data, and converts that data into an analog signal. This analog signal will be referred to as an “image signal” hereinafter. The image signal expresses each pixel with four color, or R, G, B, and G, signals, and corresponds to the respective four colors of the sub-pixels. The liquid-crystal panel 132 drives each pixel based on this image signal, and controls the tones in each pixel.

Figure 6:
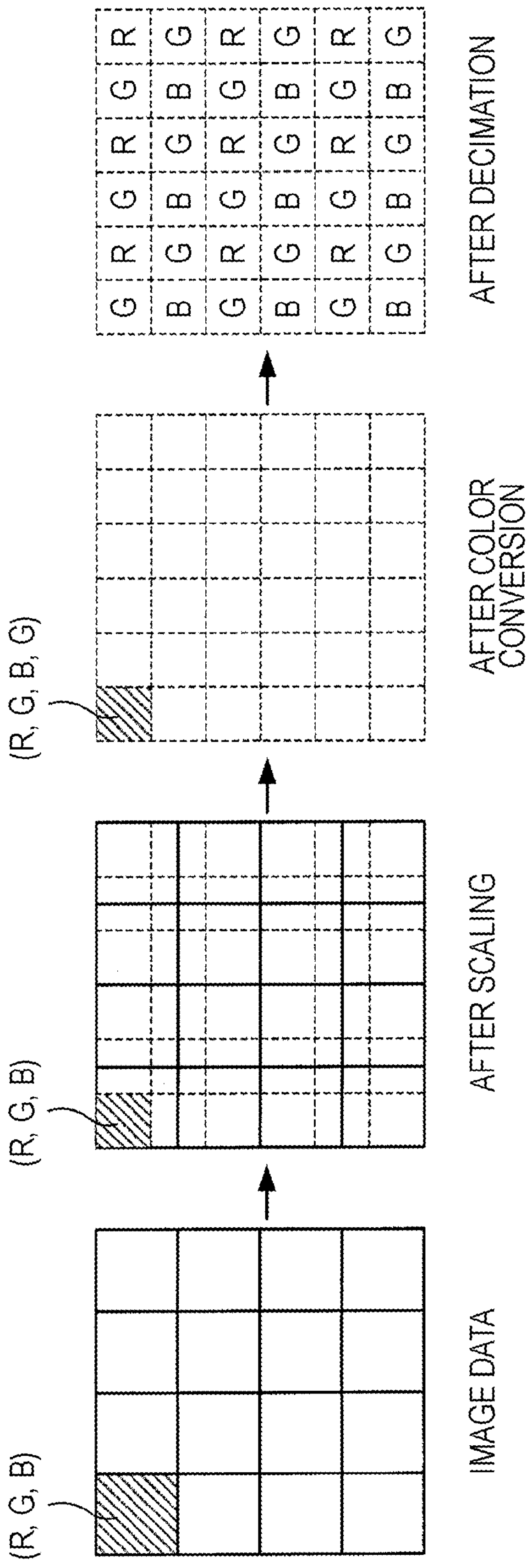
FIG. 6 is a diagram illustrating a scaling process, a color conversion process, and a decimation process performed by an image processing unit.

FIG. 6 is a diagram illustrating the scaling process, the color conversion process, and the decimation process performed by the image processing unit 120. In FIG. 6, the squares expressed as solid lines indicate respective pixels of the inputted image data, whereas the squares expressed as broken lines indicate respective sub-pixels in the liquid-crystal panel 132.

The pre-scaling process image data has information of three colors, or R, G, and B, in each pixel. The scaling process expresses the same image as the image expressed by the inputted image data, but increases the number of pixels to 1.5 times in the vertical direction and the horizontal direction. Accordingly, the total number of pixels increases to 2.25 times (that is, 1.5×1.5 times) following the scaling process. As a result, the image expressed by four pixels, or two rows×two columns, prior to the scaling process, is expressed by nine pixels, or three rows×three columns, after the scaling process. Note that although the scaling process increases the number of pixels of the image data, the amount of information in each pixel is not changed (the tone values themselves, however, can change). Accordingly, the scaled image data also has information of three colors, or R, G, and B, in each pixel.

When the color conversion process is executed on the scaled image data, the information in each pixel changes from information of three colors, or R, G, and B, to information of four colors, or R, G, B, and G. In other words, the color conversion process is a process that increases the amount of information in each pixel. The decimation process that follows thereafter is a process for reducing the amount of information in the sub-pixels to ¼. In other words, the decimation process reduces the four colors' worth of information thus far allocated to each of the sub-pixels to only one colors' worth of information corresponding to that sub-pixel.

When the image processes according to this embodiment are executed, a length corresponding to the sides of two pixels in the inputted image data matches a length corresponding to the sides of three pixels in the post-scaling process pixels (sub-pixels), as shown in FIG. 6; that pattern repeats thereafter. Such a pattern is referred to as a “repeated pattern” hereinafter. The cycle of the repeated pattern in the case where the scaling rate of the scaling process is 1.5 times is shorter than the cycle of the repeated pattern in the case where the scaling rate of the scaling process is approximately $\sqrt{2}$ times (for example, 1.4142 times). Note that here, “approximately $\sqrt{2}$ times” refers to a scaling rate of a predetermined number of digits approximate to $\sqrt{2}$, which is an irrational number.

According to the image processes of this embodiment, setting the scaling rate of the scaling process to 1.5 times compensates for a drop in resolution caused by the decimation process, and makes it possible to realize an image display in which moirés are less noticeable. Because the repeated pattern is cyclic in nature, this embodiment does not necessarily ensure that moirés will not appear at all. However, because the cycle of the repeated pattern is shorter in this embodiment, moirés caused by the cyclic nature of the repeated pattern can be made less visually noticeable to the human eye.

Variations

The invention is not limited to the aforementioned embodiment, and can be carried out in a variety of ways, as indicated by the examples described hereinafter. Furthermore, the invention can also be carried out by combining a plurality of the variations described hereinafter as necessary.

1. The invention achieves its maximum effect when the scaling rate of the scaling process is 1.5 times (3/2 times). However, the invention is not limited to a scaling rate of 1.5 times for the scaling process, and a constant effect can be achieved if the scaling rate is expressed as a ratio of two integers. However, in consideration of the balance between the resolution of the inputted image data and the resolution of the image that is actually displayed, it is desirable for the scaling rate of the scaling process to be within a range that fulfils $1<n/m<2$, where m and n are integers, and it is further desirable for $1.25 \leq n/m \leq 1.75$.

To go further, it is desirable for the scaling rate of the scaling process to be as close to $\sqrt{2}$ as possible while also reducing the value of m in the stated n/m to the greatest extent possible. It is desirable for the value of m to be, for example, less than or equal to 10; at that level, moirés are made less visually noticeable, but it is even more desirable for that value to be less than or equal to 4. 5/4 (=1.25), 7/5 (=1.4), 10/7 (≈1.42857), 8/5 (=1.6), 7/4 (=1.75), and so on can be given as examples of desirable scaling rates. If such a scaling rate is used, the cycle of the repeated pattern becomes comparatively short.

Figure 7:
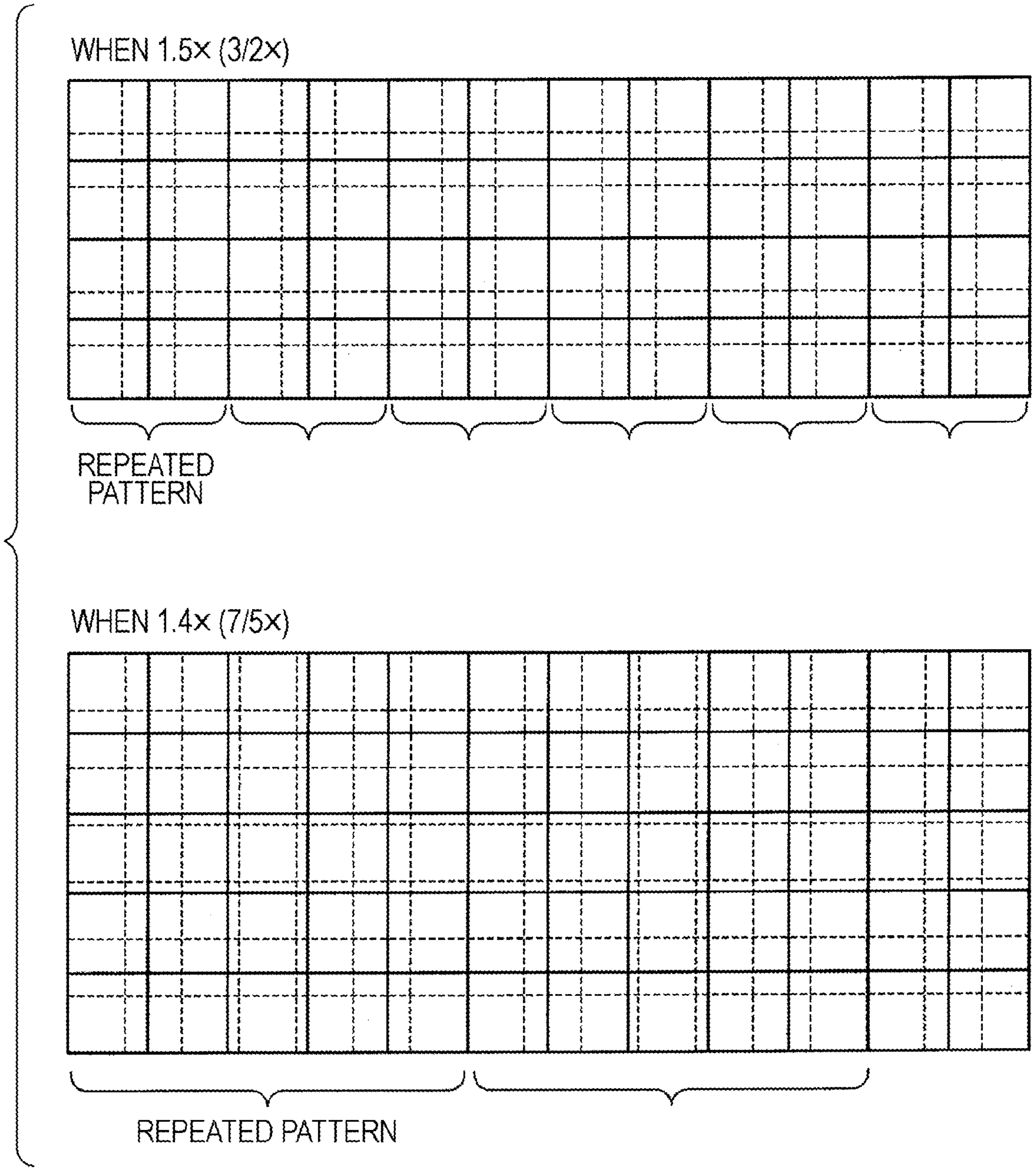
FIG. 7 is a diagram illustrating cycles of repeated patterns.

FIG. 7 is a diagram illustrating cycles of the repeated pattern, and is a diagram that compares the repeated patterns in a case where the scaling rate of the scaling process is 1.5 times (3/2 times) with a case where the scaling rate is 1.4 times (7/5 times). As shown in FIG. 7, the cycle of the repeated pattern becomes shorter the lower the value of m is. Accordingly, the lower the value of m, the shorter the cycle of moirés caused by the cyclic nature of the repeated pattern becomes. When taking into consideration the size of the typical pixel, the shorter the cycle of the repeated pattern, the less visible moirés caused by that repeated pattern will become.

2. The display panel in the invention is not limited to a transmissive liquid-crystal panel. For example, the display panel in the invention may be a liquid-crystal panel that employs a reflective liquid-crystal element, or may be what is known as an LCOS (Liquid Crystal on Silicon) panel. Furthermore, the light modulating element of the invention is not limited to a liquid-crystal element, and may be a selfluminous light modulating element such as an organic EL (electroluminescence) element.

In addition, the display panel in the invention may be any panel having sub-pixels of a number greater than or equal to n/m times the number of pixels in the inputted image data, and it is not necessary for the number of sub-pixels to be exactly n/m times the number of pixels in the image data. In the case where the number of sub-pixels exceeds n/m times the number of pixels in the image data, a number of sub-pixels equivalent to n/m times the number of pixels in the image data may be used for the display of the image expressing that image data, while the remaining sub-pixels are not used in the display of the image. In addition, the display panel in the invention need not be wider in the horizontal direction, and may instead be taller in the vertical direction. Note that the inputted image data in the invention is also not limited to the nHD size, and may be set in accordance with the resolution of the display panel.

3. The pixels of the display panel in the invention are not limited to the arrangement described in the aforementioned embodiment. For example, assuming the configuration illustrated in FIG. 2, the display panel of the invention may have the positions of the R sub-pixels switched with the positions of the B sub-pixels, or may have the positions of the R and B sub-pixels switched with the positions of the G sub-pixels.

In addition, in the configuration illustrated in FIG. 2, the display panel of the invention can also be such that one of the two G sub-pixels is configured as a sub-pixel of another color. The "other color" referred to here is, for example, white, but is not necessarily limited to white as long as the color has a common color component with the G sub-pixels. However, the filtering processes employed in the case where four mutually different colors are allocated to the four sub-pixels will all have the properties shown in FIG. 4A.

4. The display apparatus according to the invention is not limited to a projector, or in other words, to a device that displays an image by projecting light onto a projection surface, and may instead be what is known as a direct-view display apparatus, where an image is displayed in a display panel and that image is viewed directly. Furthermore, the display apparatus according to the invention may configure a part of another electronic device, such as a mobile telephone that includes a projector.

Finally, although the display apparatus according to the invention is not necessarily limited to a small-size projector, the effects of the invention are particularly apparent when an image is displayed at the greatest possible brightness using a display panel having a comparatively low number of pixels.

This application claims priority to Japan Patent Application No. 2011-221876 filed Oct. 6, 2011, the entire disclosures of which are hereby incorporated by reference in their entireties.

What is claimed is:

1. An image processing apparatus for displaying an image in a display panel in which pixels configured of four sub-pixels, with two sub-pixels each disposed in a first direction and a second direction orthogonal to the first direction, are disposed in matrix form, the apparatus comprising:

an obtainment unit that obtains image data in which each pixel disposed in the first direction and the second direction is expressed as a three-color tone value;

a scaling unit that enlarges the first direction and second direction sizes, respectively, of an image expressed by the image data obtained by the obtainment unit by a scaling rate of (n/m) times (where m and n are predetermined integers that fulfill $1<(n/m)<2$);

a color conversion unit that converts the three-color image data enlarged by the scaling unit into four-color image data that corresponds to the four sub-pixels; and a decimating unit that reduces the number of pixels in the image data resulting from the conversion performed by the color conversion unit in accordance with the disposition of the four sub-pixels.

2. The image processing apparatus according to claim 1, wherein $m \leq 10$.

3. The image processing apparatus according to claim 2, wherein m=2 and n=3.

4. A display apparatus comprising:

the image processing apparatus, which includes the display panel according to claim 1, in which the total number of the sub-pixels is greater than or equal to (n/m) times the number of pixels in the image data.

5. An image processing method for displaying an image in a display panel in which pixels configured of four sub-pixels, with two sub-pixels each disposed in a first direction and a second direction orthogonal to the first direction, are disposed in matrix form, the method comprising:

obtaining image data in which each pixel disposed in the first direction and the second direction is expressed as a three-color tone value;

executing a scaling process that enlarges the first direction and second direction sizes, respectively, of an image expressed by the obtained image data by a scaling rate of (n/m) times (where m and n are predetermined integers that fulfill $1<(n/m)<2$);

executing a color conversion process that converts the three-color image data enlarged by the scaling process into four-color image data that corresponds to the four sub-pixels; and executing a decimation process that reduces the number of pixels in the image data resulting from the color conversion process in accordance with the disposition of the four sub-pixels.

6. The image processing apparatus according to claim 1, wherein m and n are positive integers.

7. The image processing apparatus according to claim 5, wherein m and n are positive integers.

* * * * *